United States Patent [19]

Lur et al.

[11] Patent Number: 5,895,252
[45] Date of Patent: *Apr. 20, 1999

[54] FIELD OXIDATION BY IMPLANTED OXYGEN (FIMOX)

[75] Inventors: Water Lur, Taipei; Cheng Han Huang, Hsin-chu, both of Taiwan

[73] Assignee: United Microelectronics Corporation, Taiwan, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/552,209

[22] Filed: Nov. 2, 1995

Related U.S. Application Data

[63] Continuation of application No. 08/239,425, May 6, 1994, abandoned.

[51] Int. Cl.$^6$ ............................................. H01L 21/76
[52] U.S. Cl. .................... 438/423; 438/766; 438/440; 438/966; 438/528
[58] Field of Search ......................... 438/423, 440, 438/770, FOR 229, 776, 966, 528, FOR 158, FOR 451

[56] References Cited

U.S. PATENT DOCUMENTS

| | | |
|---|---|---|
| 3,666,548 | 5/1972 | Brack et al. |
| 3,840,409 | 10/1974 | Ashar. |
| 4,676,841 | 6/1987 | Celler. |
| 4,885,618 | 12/1989 | Schubert et al. |
| 4,912,062 | 3/1990 | Verma. |
| 4,975,126 | 12/1990 | Margail et al. |
| 5,082,793 | 1/1992 | Li. |

FOREIGN PATENT DOCUMENTS

| | | |
|---|---|---|
| 56-105652 | 8/1981 | Japan. |
| 61-18149 | 1/1986 | Japan. |
| 61-228652 | 10/1986 | Japan. |
| 1-205552 | 8/1989 | Japan. |
| 210835 | 1/1990 | Japan. |
| 324727 | 2/1991 | Japan. |
| 5-121540 | 5/1993 | Japan. |
| 5175190 | 7/1993 | Japan. |

OTHER PUBLICATIONS

Wolf, S., et al, "Silicon Processing for the VLSI Era: vol.1, Process Technology", Lattice Press, p.327, 1986.
Wolf, S., et al, Silicon Processing for the VLSI Era, vol. 1; Process Technology, Lattice Press, 1986, pp. 307–308, 321, 529–531.
"Selectively Implanted Oxygen Isolation Technology (SIO)", P. Ratman et al, Electronics Letters, May 9, 1985, vol. 21 No. 10 pp. 442–443.

*Primary Examiner*—George Fourson
*Attorney, Agent, or Firm*—Rabin & Champagne, P.C.

[57] ABSTRACT

A method of forming a field oxide isolation region is described, in which a masking layer is formed over a silicon substrate. The masking layer is patterned to form an opening for the field oxide isolation region, whereby the remainder of the masking layer forms an implant mask. A conductivity-imparting dopant is implanted through the opening into the silicon substrate. Oxygen is implanted through the opening into the silicon substrate in multiple implantation steps. The implant mask is removed. The field oxide isolation region is formed in and on the silicon substrate, by annealing in a non-oxygen ambient. Alternately, the field oxide isolation region is formed by annealing in oxygen, simultaneously forming a gate oxide in the region between the field oxide isolation regions.

10 Claims, 3 Drawing Sheets

FIELD OXIDATION BY IMPLANTED OXYGEN (FIMOX)

This is a continuation of U.S. application Ser. No. 08/239,425 filed May 06, 1994, now abandoned.

BACKGROUND OF THE INVENTION

(1) Field of the Invention

The invention relates to the manufacture of highly dense integrated circuits and more particularly to the formation of field oxide isolation regions within the integrated circuits by selective oxygen implantation.

(2) Description of the Related Art

In the manufacture of highly dense integrated circuits, individual device structures are typically separated and electrically isolated by means of a field oxide isolation region. The isolation region is typically produced by the exposure of a silicon wafer to an oxidizing atmosphere while using an oxidation mask to protect regions which are not desired to be oxidized. These latter regions will be the location for the active device structures. One widely used technique for creating isolation regions is LOCOS—LOCal Oxidation of Silicon.

In the LOCOS technique, a pad oxide is grown on the surface of a silicon substrate. The pad oxide reduces stresses during field oxidation between the silicon substrate and a subsequently deposited silicon nitride layer. The silicon nitride is deposited by chemical vapor deposition (CVD) on the surface of the pad oxide, and then patterned to create an oxidation mask. The silicon nitride forms an effective mask during field oxidation due to the slow speed with which oxygen and water vapor diffuses in the nitride. The oxidation mask is formed by dry etching the nitride and pad oxide in the region in which it is desired to form the field oxide. An implant is performed in the field region to create a channel-stop doping layer under the field oxide. The field oxide is then grown by wet oxidation, at a temperature of about 1000° C. The masking layer is removed by a wet etch. A sacrificial pad oxide is then formed and removed, to prepare for subsequent formation of the gate oxide.

The LOCOS technology has been used widely, but it presents several drawbacks at dimensions between 1 and 2 micrometers, and for submicron technology the conventional LOCOS cannot be used without significant modification. Among the problems that have been encountered are (1) "bird's beak" formation, (2) nitride-induced defects, (3) "white ribbon" formation, and (4) field oxide thinning. During oxidation, there is significant lateral oxidation encroachment from under the nitride mask, resulting in the formation of a "bird's beak" structure at the perimeter of the field oxide, which reduces the area available in the active region, thus lowering the total number of devices that can be fit onto a single integrated circuit chip. The presence of silicon nitride causes the formation of line and/or planar defects around the bird's beak, which can cause junction failure.

The "white ribbon", caused by the long wet oxidation required to form the thick field oxide, consists of nitrogen or ammonium which diffuses through the silicon oxide ($SiO_2$) films so that silicon nitride forms at the $SiO_2$—Si boundary along the LOCOS edge. This has a masking action against oxidation and consequently the gate oxide of MOS (Metal Oxide Semiconductor) structures may become too thin near the field oxide edge, leading to gate oxide failure. Finally, the thickness of the field oxide in submicron regions of the exposed silicon is significantly less than that in wider spacings. This field oxide thinning can produce problems with respect to field threshold voltages, interconnect-to-substrate capacitance, and field edge leakage.

Workers in the field are aware of these problems. Improvements in the LOCOS technology fall into three broad categories:

(1) An additional barrier to oxygen diffusion is added around the perimeter of the LOCOS stack, usually in the form of a nitride-sidewall spacer, as in SWAMI (Side WAll Masked Isolation). However, the increased process complexity leads to a prohibitive increase in cost.

(2) The pad oxide is eliminated, and a very thin nitride mask used, to minimize the generation of stress-induced defects, using, for example, the SILO (Sealed Interface Local Oxidation) technique. However, there are difficulties in completely removing the nitride layer after field oxidation, and the enhanced stress, induced by the extremely abrupt nature of the boundary between field oxide and active regions, results in poor gate oxide formation and junction integrity.

(3) The pad oxide is replaced with oxynitride, e.g., in the Philips SLOCOS (Suppressed LOCOS) process. However, there are indications that oxynitride is not as effective as the conventional thermal oxide in relieving nitride-induced stresses, and can also result in gate oxide thinning.

Another approach is that described in U.S. Pat. No. 4,912,062 (Verma), in which an impurity such as arsenic, boron, phosphorus or antimony is implanted in the field region prior to field oxidation, to enhance oxide growth. A photoresist mask can be used, instead of nitride, since the field oxidation can be accomplished in a much shorter period of time due to the impurity implant. After field oxidation, the oxide over the active region is removed. An overetch is necessary to insure complete removal of the active region oxide, in preparation for subsequent formation of a gate oxide. However, this overetch can attack the stressed areas at the perimeter of the field oxide, resulting in "bird's neck" morphology and degradation of gate electrode integrity.

A shorter oxidation period can also be obtained by implantation of oxygen in the field region, prior to field oxidation, as described in "Selectively Implanted Oxygen Isolation Technology (SIO)", P. Ratnam et al, Electronics Letters, May 9, 1985, Vol. 21 No. 10, pp. 442–443. Oxygen is selectively implanted to create a damaged Si—$SiO_x$—Si layer in the field region, which is then thermally oxidized for a short period to form the field oxide. There still exist nitride-induced defects, and "white ribbon" effect problems with this approach.

SUMMARY OF THE INVENTION

Accordingly, it is a principal object of the invention to provide an improved, and simplified, method for forming field oxide isolation regions.

It is a further object of the invention to provide a method of forming field oxide isolation regions for submicron technology.

It is a further object of the invention to provide a method to reduce the bird's beak length of the field oxide.

It is a further object to provide a method of forming field oxide isolation regions in which it is not required to use a nitride mask, thus reducing defects.

It is a further object of the invention to provide a method of forming field oxide isolation regions simultaneously with the formation of a gate oxide for an FET device.

These objects are achieved by a method of forming a field oxide isolation region, in which a masking layer is formed over a silicon substrate. The masking layer is patterned to form an opening for the field oxide isolation region, whereby the remainder of the masking layer forms an implant mask. A conductivity-imparting dopant is implanted through the opening into the silicon substrate. Oxygen is implanted through the opening into the silicon substrate. The implant mask is removed. The field oxide isolation region is formed in and on the silicon substrate, by annealing in a non-oxygen ambient.

In a further embodiment of the invention, a masking layer is formed over a silicon substrate. The masking layer is patterned to form an opening for the field oxide isolation region, whereby the remainder of the masking layer forms an implant mask. A conductivity-imparting dopant is implanted through the opening into the silicon substrate. Oxygen is implanted through the opening into the silicon substrate. The implant mask is removed. The field oxide isolation region is formed in and on the silicon substrate, by annealing in oxygen. A second insulating layer is formed on the silicon substrate, between the field oxide isolation regions, simultaneously with the forming of the field oxide isolation regions, whereby the second insulating layer forms a gate oxide for the subsequent formation of a field effect transistor.

DESCRIPTION OF THE PREFERRED EMBODIMENTS

Referring now more particularly to FIGS. 1 to 5, there is shown a first method for making the field oxide isolation region of the present invention, referred to as FIMOX (Field isolation by IMplanted OXygen). A single-crystal silicon substrate 10 of crystal orientation {100}, {110}, or {111} is provided which has been lightly doped with boron or phosphorus at a dosage of between about $1\times10^{13}$ and $5\times10^{15}$ ions/cm$^3$. The wafer is thus p-type or n-type with a resistivity of between about 1 and 100 ohm-centimeters. Typically, Czochralski growth silicon wafers are doped to these concentrations.

Figure 1:
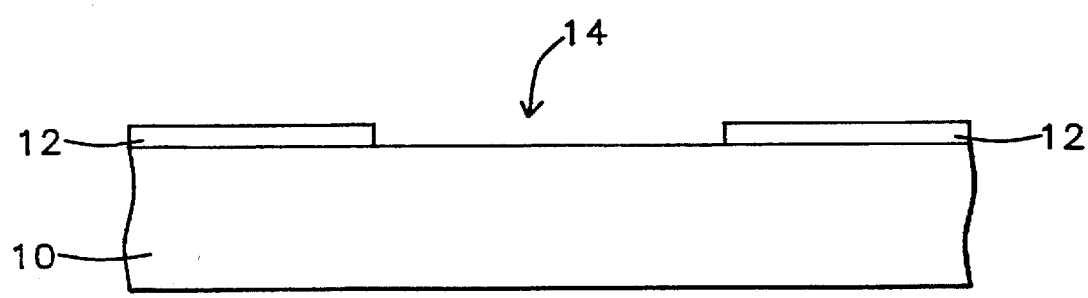
FIGS. 1 to 5 are a cross-sectional representation of one method of the invention for forming a field oxide isolation region.
Figure 2:
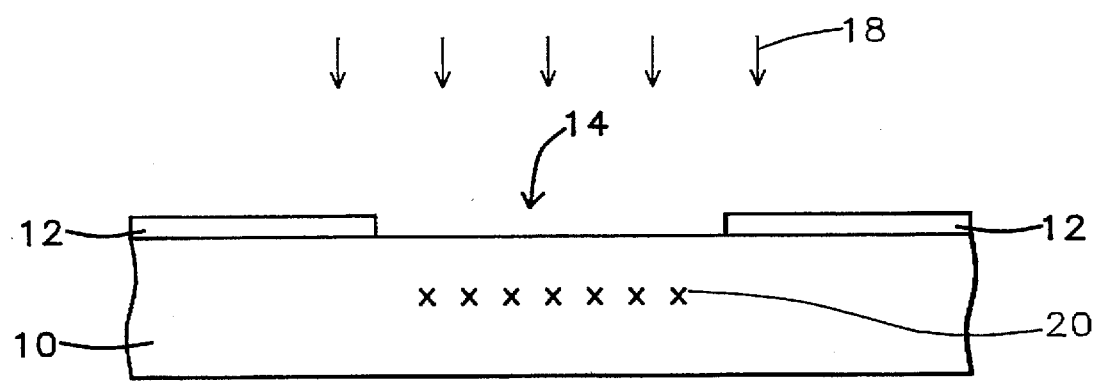

An implant mask layer is formed over the substrate. Unlike LOCOS where nitride is required to be used, the implant mask layer of the invention can be one of several different materials, such as oxide, oxynitride, nitride, tungsten or another metal, or photoresist. In one example, an oxide layer is formed by chemical vapor deposition to a thickness of between about 2000 and 5000 Angstroms at a temperature of about 400° C. The thickness of the implant mask may vary with the material used and the implantation energy, but the thickness given above should be sufficient for most materials. The thickness of this layer must be sufficient to prevent penetration of implanted oxygen into the masked regions during the subsequent oxygen implantation step. Where planarization of the field oxide is important, an oxide layer is preferred to be used as the implant mask. This layer is patterned, as shown in FIG. 1, using conventional lithography and etching to form implant mask 12 which masks the active region locations, and to form openings 14 at the desired locations of the field oxide region.

After patterning of the implant mask, a channel stop implant 18 is performed. If a p-type dopant is desired, boron 20 is ion implanted at a dosage of between about $1\times10^{13}$ and $1\times10^{14}$ ions/cm$^2$ and at an energy of between about 50 and 150 KeV. The channel-stop implant serves to prevent inversion of p-type silicon under the field oxide. The channel-stop implant may alternately be performed after the formation of the thick field oxide, with a larger implantation energy required to penetrate the thick field oxide.

Figure 3:
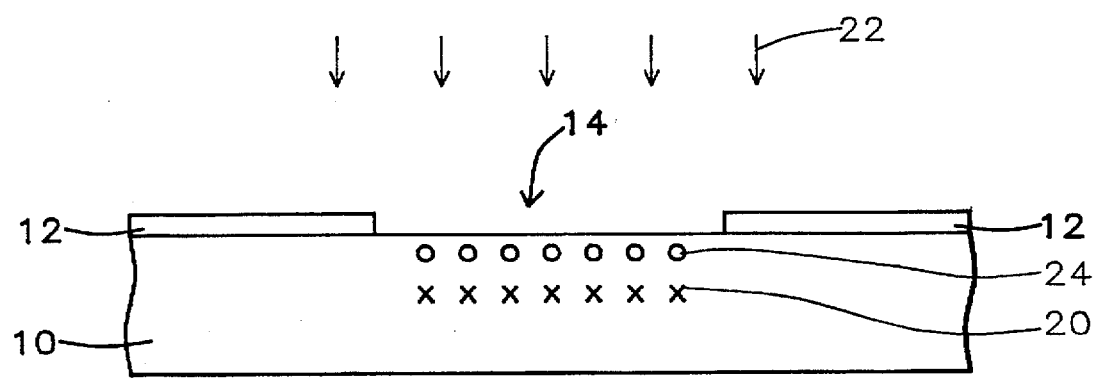

Subsequently, referring now to FIG. 3, the critical oxygen implant 22 is performed, using the same implant mask as for the channel stop implant, to implant oxygen 24 in the substrate. A single or double implant may be performed. For a single implant, a dosage of between about $1\times10^{18}$ and $3\times10^{18}$ ions/cm$^2$ and an energy of between about 30 and 150 KeV is used. A dosage of about $2\times10^{18}$ ions/cm$^2$ and an energy of about 80 KeV results in an oxygen concentration of about $1\times10^{23}$ ions/cm$^3$ at a depth of between about 1000 and 3000 Angstroms, and a resulting field oxide thickness of about 4000 Angstroms.

For a double implant, a dosage of between about $1\times10^{18}$ and $3\times10^{18}$ ions/cm$^2$ and an energy of between about 30 and 150 KeV is used for both implants. This results in considerable substrate damage and a high concentration of oxygen atoms, on the order of between about $4\times10^{22}$ and $2\times10^{23}$ ions/cm$^3$ to a depth of between about 300 and 4000 Angstroms. The oxidation rate during the subsequent field oxidation is controlled by the diffusion of oxygen atoms through silicon. In this invention, many interstitials and vacancies are created after implantation, and the damaged substrate favors the diffusion of oxygen atoms therein. A double implant is preferred to obtain uniform oxygen concentration. Also, by using a double implant a larger damaged region can be obtained. However, greater process time is required than for a single implant.

Figure 4:
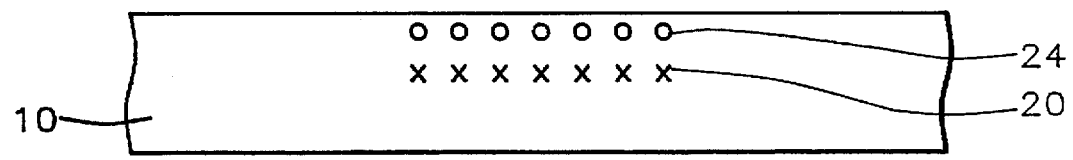

After the above implant(s), the implant mask is removed, as shown in FIG. 4, preferably by wet etching, with the silicon substrate acting as the etch endpoint. In the example from above in which silicon dioxide (SiO$_2$) is used as the implant mask layer, this etch is performed by dipping in a hydrofluoric acid (HF) solution. For example, an oxide layer with a thickness of about 3000 Angstroms can be stripped in HF:H$_2$O solution at a 10:1 ratio for 10 minutes, at room temperature.

Figure 5:
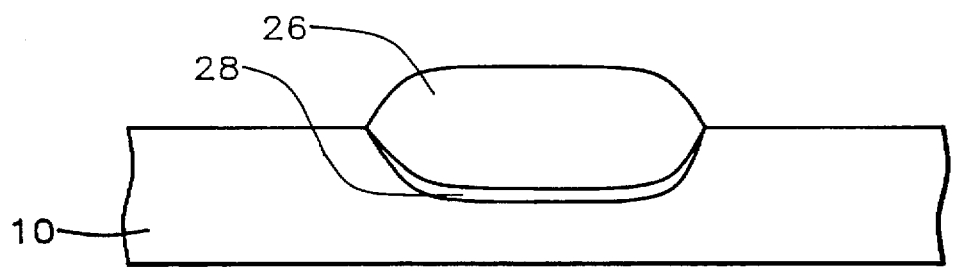

Referring now to FIG. 5, the field oxidation is performed, without the oxidation mask which is used in conventional LOCOS. In the first method of the invention, the field oxide 26 is formed in an ambient of argon, nitrogen, or any inert gas without oxygen, at a temperature of between about 800 and 1000° C., for between about 0.5 and 10 minutes. Alternately, the field oxide 26 may be formed by a rapid thermal anneal, at a temperature of between about 900 and 1050° C. for between about 0.5 and 3 minutes. The resultant field oxide 26 has a thickness of between about 3000 and 6000 Angstroms. The oxidation time is much faster than the field oxidation using LOCOS, which is on the order of many hours. This is due to damage to the substrate and the presence of the implanted oxygen ions. The oxidation rate of seriously ion-damaged silicon is more than three times that of an unimplanted silicon substrate. Since there is a high concentration of (implanted) oxygen already present, during the high-temperature oxidation step the implanted oxygen diffuses easily into the damaged silicon structure, and less time is needed to form the thick field oxide. Therefore, less oxidation time is required. At the same time as the formation of the field oxide, the channel stop implant is activated.

In this method of the invention, a gate oxide (not shown) may be formed immediately after the field oxidation. In conventional LOCOS, on the other hand, a sacrificial oxide must be formed and stripped prior to gate oxide formation, due to the nitride-induced white ribbon effect. Since a nitride mask is not needed for the invention, the sacrificial oxide steps can be deleted, reducing the process time.

Figure 6:
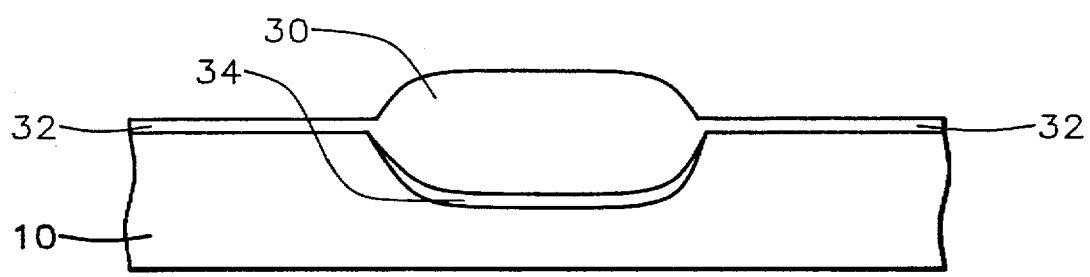
FIG. 6 is a cross-sectional representation of the resulting structure using a second method of the invention for forming a field oxide isolation region.

In the second method of the invention, the process steps are the same as in the first method, up to the formation of the FIG. 4 structure. After removal of the implant mask, an oxidation is performed to simultaneously form the field oxide 30 and gate oxide 32, as shown in FIG. 6. An anneal is performed in an oxygen ambient, which has a small amount of oxygen, for example, $O_2$ or $H_2O$ at between about 5 and 20%. This anneal is at a temperature of between about 800 and 950° C. for between about 10 and 20 minutes. The anneal is followed by a rapid thermal anneal (RTA) without oxygen at between about 1000 and 1100° C. for between about 30 and 180 seconds. The field oxide 30 that results has a thickness of between about 3000 and 6000 Angstroms. Channel stop implant 34 is activated at the same time by the above annealing steps. This method further reduces the complexity of processing, as compared to LOCOS, by forming a high-quality gate oxide simultaneously with the field oxide formation. The gate oxide 32 has a resulting thickness of between about 50 and 500 Angstroms.

Figure 7:
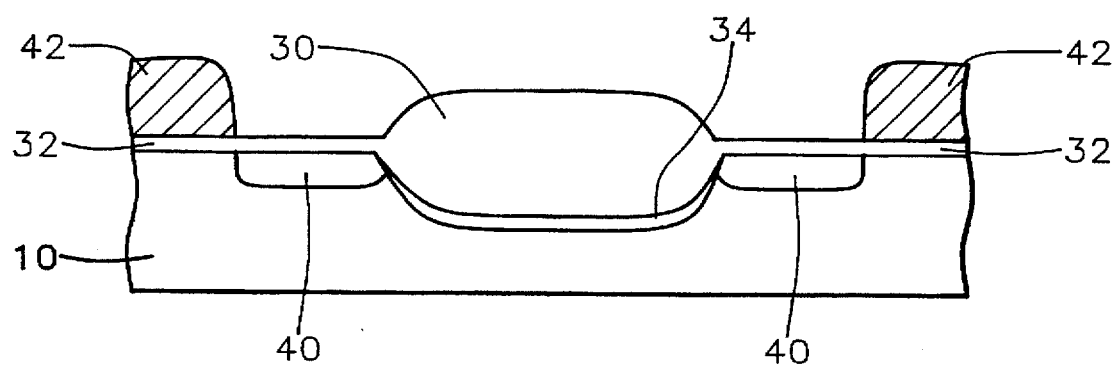
FIG. 7 is a cross-sectional representation of the resulting structure using the second method of the invention for forming a field oxide isolation region, and subsequently forming a field effect transistor.

Field effect transistors (FETs) may now be formed immediately following the field oxide/gate oxide formation shown in FIG. 6. As shown in FIG. 7, source/drain regions 40 and gate 42 may be formed in and on the active regions, using oxide 32 as a gate oxide for the FET device, as is known in the art. Further processing (not shown) would then occur to complete manufacture of the integrated circuit, such as formation of a thick dielectric over the devices, contact formation, metallization and passivation.

The methods of the invention offer many advantages over the prior art. In either method of the invention, since there is no etching of oxide from the active regions after formation of the field oxide isolation regions, there is no problem with overetching at the field oxide perimeter. The bird's beak length is greatly reduced by the invention, since diffusion length is generally proportional to the square root of oxidation time, and oxidation time of the invention is much shorter than that for conventional LOCOS techniques. Since silicon nitride is not needed as an implant mask and oxidation inhibitor, the problems of stress-induced defects and the "white ribbon" effect are eliminated. Also, since a global oxidation is used, the oxide thinning effect is eliminated.

Furthermore, manufacturability is improved. Since there is no nitride removal or sacrificial oxide formation required, unlike conventional LOCOS, and the implant mask layer can be formed of one of many different materials, the manufacturing process is very simple and less processing steps typically provides higher yields. Throughput is also improved since the field oxidation time is much reduced as compared to LOCOS and other prior art techniques.

Stress-related defects are also reduced. The field area is implantation amorphized prior to formation of the field oxide, and it is believed that amorphous and polycrystalline silicon can cushion more stress than single-crystal silicon. Since the field oxidation is accomplished without any mask, there is no patterned nitride layer that typically dominates the generation of stress during thermal treatment.

An improvement in the planarization of field oxide can be obtained by pre-etching of the silicon substrate, in the field region, prior to the channel stop and oxygen implants. By using a pre-etch of about 0.2 micrometers of the substrate, a step-height of less than 0.1 micrometers can be obtained.

While the invention has been particularly shown and described with reference to the preferred embodiments thereof, it will be understood by those skilled in the art that various changes in form and details may be made without departing from the spirit and scope of the invention.

What is claimed is:

1. A method of forming a field oxide isolation region, comprising:

forming a masking layer of a masking material over a silicon substrate;

patterning said masking layer to form an opening for said field oxide isolation region, whereby the remainder of said masking layer forms an implant mask;

implanting dopant ions through said opening into said silicon substrate to form a channel-stop implant;

implanting oxygen ions through said opening into said silicon substrate in a first oxygen ion implantation at a first energy level, to produce an oxygen concentration in an oxygen implantation region of the substrate;

after completion of the first oxygen ion implantation, implanting oxygen ions through said opening into said silicon substrate in a distinct second oxygen ion implantation at a second energy level that is at least about as great as the first energy level, to increase oxygen concentration, uniformity, and depth in the oxygen implantation region of the substrate;

removing said implant mask; and after removing said implant mask, forming said field oxide isolation region in and on said silicon substrate by annealing in a non-oxygen ambient.

2. The method of claim 1, wherein said first oxygen ion implantation is made at a dosage of between about $1\times10^{18}$ and $3\times10^{18}$ ions/cm$^2$ and at an energy of between about 30 and 150 KeV.

3. The method of claim 2, wherein said second oxygen ion implantation is made at a dosage of between about $1\times10^{18}$ and $3\times10^{18}$ ions/cm$^2$ and at an energy of between about 30 and 150 KeV, whereby said oxygen ions are implanted at a depth of between about 300 and 4000 Angstroms.

4. The method of claim 1, wherein said field oxide isolation region is formed by annealing in an ambient of argon, at a temperature of between about 800 and 1000° C. for between about 0.5 and 10 minutes.

5. The method of claim 1, wherein said field oxide isolation region is formed by annealing in an ambient of nitrogen, at a temperature of between about 800 and 1000 ° C. for between about 0.5 and 10 minutes.

6. The method of claim 1, wherein said field oxide isolation region is formed by a rapid thermal anneal, at a temperature of between about 900 and 1050 ° C. for between about 0.5 and 3 minutes.

7. The method of claim 1, wherein said field oxide isolation region is formed to a thickness of between about 3000 and 6000 angstroms.

8. The method of claim 1, wherein said masking layer is an oxide layer, formed to a thickness of between about 2000 and 5000 angstroms.

9. The method of claim 1, wherein said masking layer is a photoresist layer, formed to a thickness of between about 3000 and 20,000 angstroms.

10. The method of claim 1, wherein said removing said implant mask is performed by a wet chemical etch.

* * * * *